United States Patent
Elaasar (10) Patent No.: US 12,537,480 B2
(45) Date of Patent: Jan. 27, 2026

(54) PHASE NOISE FILTER FOR OSCILLATOR CIRCUITRY

(71) Applicant: Apple Inc., Cupertino, CA (US)

(72) Inventor: Omar E Elaasar, San Diego, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/657,778

(22) Filed: May 8, 2024

(65) Prior Publication Data

US 2025/0350240 A1  Nov. 13, 2025

(51) Int. Cl.
*H03B 5/12* (2006.01)

(52) U.S. Cl.
CPC ..... *H03B 5/1212* (2013.01); *H03B 2200/009* (2013.01)

(58) Field of Classification Search
CPC .......................... H03B 5/1212; H03B 2200/009
USPC ................. 331/177 V, 167, 117 FE
See application file for complete search history.

(56) References Cited

U.S. PATENT DOCUMENTS

| | | | |
|---|---|---|---|
| 7,386,286 B2 | 6/2008 | Petrovic et al. | |
| 7,847,650 B2 * | 12/2010 | Yao | H03B 5/1212 |
| | | | 331/177 V |
| 8,258,877 B2 | 9/2012 | Goel et al. | |
| 9,374,036 B2 | 6/2016 | Ximenes et al. | |
| 9,831,847 B2 | 11/2017 | Babaie et al. | |
| 11,496,094 B1 * | 11/2022 | Strom | H03B 5/1212 |
| 2010/0277207 A1 * | 11/2010 | Mahdavi | H03B 19/14 |
| | | | 331/117 FE |

* cited by examiner

*Primary Examiner* — Arnold M Kinkead
(74) *Attorney, Agent, or Firm* — Treyz Law Group; Jason Tsai (57) ABSTRACT

An electronic device may include wireless circuitry having an oscillator. The oscillator can include a first transistor having a source-drain terminal coupled to a tail node, a second transistor having a source-drain terminal coupled to the tail node, a first coil having a first terminal coupled to the tail node and having a second terminal coupled to a power supply line, and a second coil inductively coupled to the first coil. The first and second coils can be part of a balun. The balun can be coupled to a tunable capacitance. The tunable capacitance can include multiple differential switchable capacitor circuits. The balun and the tunable capacitance can form a balun phase noise filter configured to reduce a phase noise associated with the oscillator.

19 Claims, 6 Drawing Sheets

PHASE NOISE FILTER FOR OSCILLATOR CIRCUITRY

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless communications circuitry in the wireless communications circuitry uses the antennas to receive and transmit radio-frequency signals.

The wireless communications circuitry can include a transceiver having one or more mixers. A mixer in the transmit path can be used to modulate signals from a baseband frequency to a radio frequency, whereas a mixer in the receive path can be used to demodulate signals from the radio-frequency to the baseband frequency. Mixers receive clock signals generated from local oscillator circuitry. It can be challenging to design satisfactory local oscillator circuitry for an electronic device.

SUMMARY

An aspect of the disclosure provides circuitry that includes a first transistor having a source-drain terminal coupled to a tail node, a second transistor having a source-drain terminal coupled to the tail node, a first coil having a first terminal coupled to the tail node and having a second terminal coupled to a power supply line, and a second coil inductively coupled to the first coil. The circuitry can further include a tunable capacitor circuit having a first terminal coupled to a first terminal of the second coil, a second terminal coupled to a second terminal of the second coil, and a center tap terminal coupled to the power supply line. The tunable capacitor circuit can include multiple switchable capacitor circuits each of which includes a switch coupled between a pair of capacitors.

An aspect of the disclosure provides oscillator circuitry that includes a first transistor having a drain terminal coupled to a first output terminal, a second transistor having a drain terminal coupled to a second output terminal, an oscillating signal being produced at the first and second output terminals, and a balun coupled to a source terminal of the first transistor and to a source terminal of the second transistor. The balun can include a first coil having a first terminal coupled to the source terminals of the first and second transistors and having a second terminal coupled to a power supply terminal and a second coil having a center tap terminal coupled to the power supply line. The oscillator circuitry can further include a tunable capacitor having a first terminal coupled to a first terminal of the second coil and having a second terminal coupled to a second terminal of the second coil.

An aspect of the disclosure provides oscillator circuitry that includes a first transistor having a first source-drain terminal coupled to a first output terminal, a second transistor having a first source-drain terminal coupled to a second output terminal, a load inductor coupled across the first and second output terminals, a tunable load capacitor coupled across the first and second output terminals, and a balun phase noise filter coupled to the first and second transistors, the balun phase noise filter being configured to reduce a phase noise associated with the oscillator circuitry. The balun phase noise filter can include a balun and a tunable capacitance coupled to the balun. The tunable capacitance can include multiple slices of differential switchable capacitor circuits.

DETAILED DESCRIPTION

Figure 1:
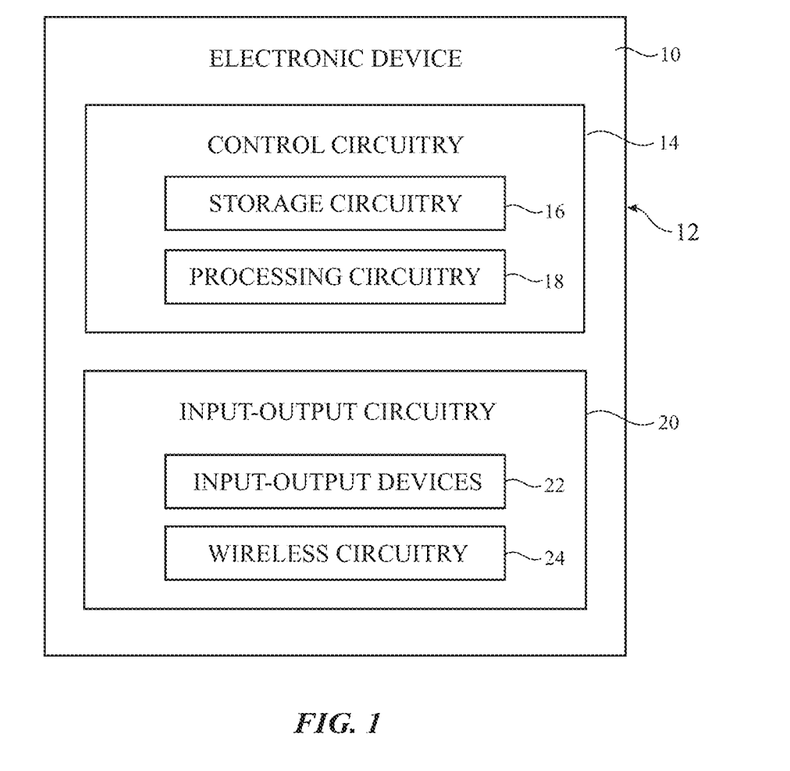
FIG. 1 is a diagram of an illustrative electronic device having wireless circuitry in accordance with some embodiments.

An electronic device such as electronic device 10 of FIG. 1 may be provided with wireless circuitry. The wireless circuitry can include one or more mixers and oscillator circuitry configured to generate oscillating signals or clock signals that are supplied to the one or more mixers. The oscillator circuitry can be a voltage controlled oscillator (VCO) having one or more inductors and a tunable capacitor. Such type of voltage controlled oscillator is sometimes referred to as an "LC" (inductor-capacitor) VCO. The oscillator circuitry can have a tail component such as a tail coil. The tail coil can be inductively coupled to a balun phase noise filter. The tail coil and the balun phase noise filter can collectively form a tail transformer. The balun phase noise filter may include a filter coil coupled to a tunable filter capacitor. The tunable filter capacitor may include a plurality of differential switchable capacitor circuits. Oscillator circuitry configured in this way is technically advantageous and beneficial by providing an improved quality factor, wider tuning range, and improved phase/flicker noise suppression at the balun phase noise filter.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHZ), a 5 GHz WLAN band (e.g., from 5180 to 5825 MHZ), a Wi-Fi® 6E band (e.g., from 5925-7125 MHZ), and/or other Wi-Fi® bands (e.g., from 1875-5160 MHZ), wireless personal area network (WPAN) frequency bands such as the 2.4 GHz Bluetooth® band or other WPAN communications bands, cellular telephone frequency bands (e.g., bands from about 600 MHz to about 5 GHZ, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHZ), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
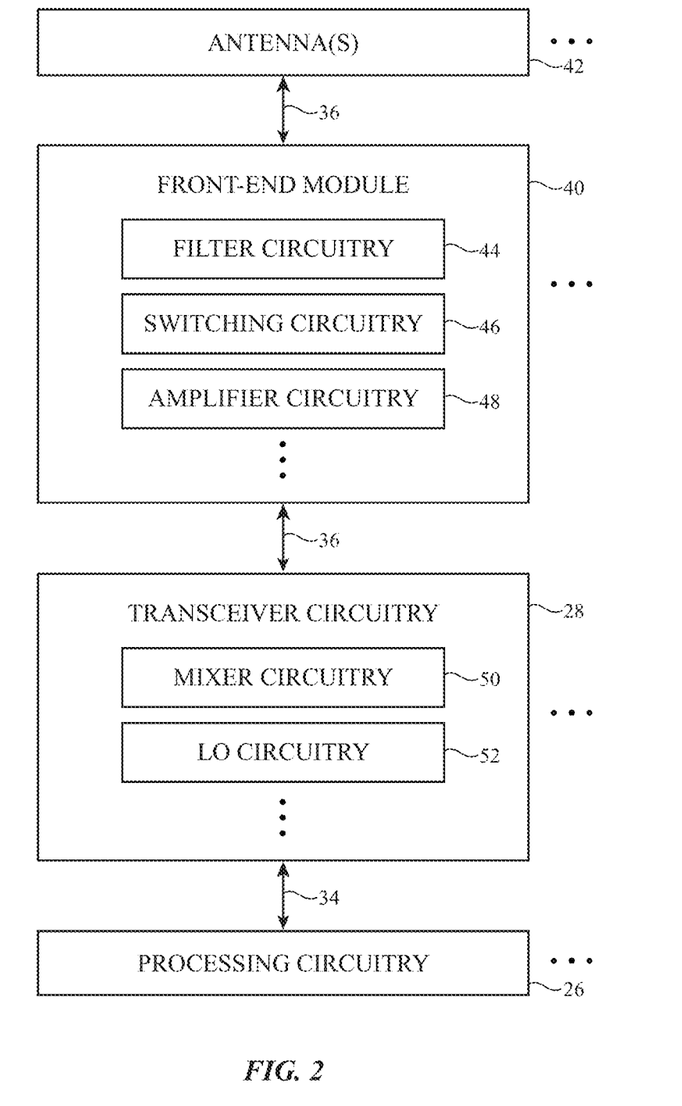
FIG. 2 is a diagram of illustrative wireless circuitry having oscillator circuitry in accordance with some embodiments.

FIG. 2 is a diagram showing illustrative components within wireless circuitry 24. Wireless circuitry 24 can include, as part of oscillator circuitry 52, a balun phase noise filter with improved phase noise suppression capabilities. As shown in FIG. 2, wireless circuitry 24 may include one or more processors such as processing circuitry 26, radio-frequency (RF) transceiver circuitry such as radio-frequency transceiver 28, radio-frequency front end circuitry such as radio-frequency front end module (FEM) 40, and antenna(s) 42. Processing circuitry 26 may be baseband processing circuitry, one or more application processor, one or more digital signal processor, one or more microcontroller, one or more microprocessor, one or more central processing unit (CPU), one or more programmable device, a combination of these circuits, and/or other types of processors within circuitry 18. Processing circuitry 26 may be configured to generate digital (transmit or baseband) signals. Processing circuitry 26 may be coupled to transceiver 28 over path 34 (sometimes referred to as a baseband path). Transceiver 28 may be coupled to antenna 42 via radio-frequency transmission line path 36. Radio-frequency front end module 40 may be interposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including processing circuitry 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module interposed thereon.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be interposed within radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

In performing wireless transmission, processor 26 may provide digital signals to transceiver 28 over path 34. Transceiver 28 may further include circuitry for converting the baseband signals received from processor 26 into corresponding intermediate frequency or radio-frequency signals. For example, transceiver circuitry 28 may include mixer circuitry 50 for up-converting (or modulating) the baseband signals to intermediate frequencies or radio frequencies prior to transmission over antenna 42. Transceiver circuitry 28 may also include digital-to-analog converter (DAC) and/or analog-to-digital converter (ADC) circuitry for converting signals between digital and analog domains. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from external wireless equipment. The received radio-frequency signals may be conveyed to transceiver 28 via radio-frequency transmission line path 36 and front end module 40. Transceiver 28 may include circuitry for converting the received radio-frequency signals into corresponding intermediate frequency or baseband signals. For example, transceiver 28 may use mixer circuitry 50 for downconverting (or demodulating) the received radio-frequency signals to baseband frequencies prior to conveying the received signals to processor 26 over path 34.

Mixer circuitry 50 can include local oscillator circuitry such as local oscillator (LO) circuitry 52. Local oscillator circuitry 52 can generate oscillator or oscillating signals that mixer circuitry 50 uses to modulate transmitting signals from baseband frequencies to radio frequencies and/or to demodulate the received signals from radio frequencies to baseband or intermediate frequencies. Local oscillator circuitry 52 can generally include phase-locked loop (PLL) circuitry configured to generate the oscillating signals being fed to inputs of mixer circuitry 50.

In practice, phase noise in this local oscillator path can have a direct impact on the signal-to-noise and distortion ratio (SNDR), which, if care is not taken, can degrade the error vector magnitude (EVM) of wireless circuitry 24. As state-of-the-art modulation schemes impose more stringent EVM requirements, the phase noise in the oscillator path can become a dominant factor in the overall link budget. The PLL circuitry can include an oscillator such as a voltage controlled oscillator (VCO). The VCO can include a tail component coupled to a filter. This tail filter can be configured to suppress the phase noise, sometimes referred to as a flicker component, associated with the oscillator circuitry. The quality factor and the tuning range of this filter impacts the amount of phase noise suppression. The quality factor and the tuning range of the tail filter can depend on the quality factor and the amount of active parasitic capacitance within the tail filter.

Figure 3:
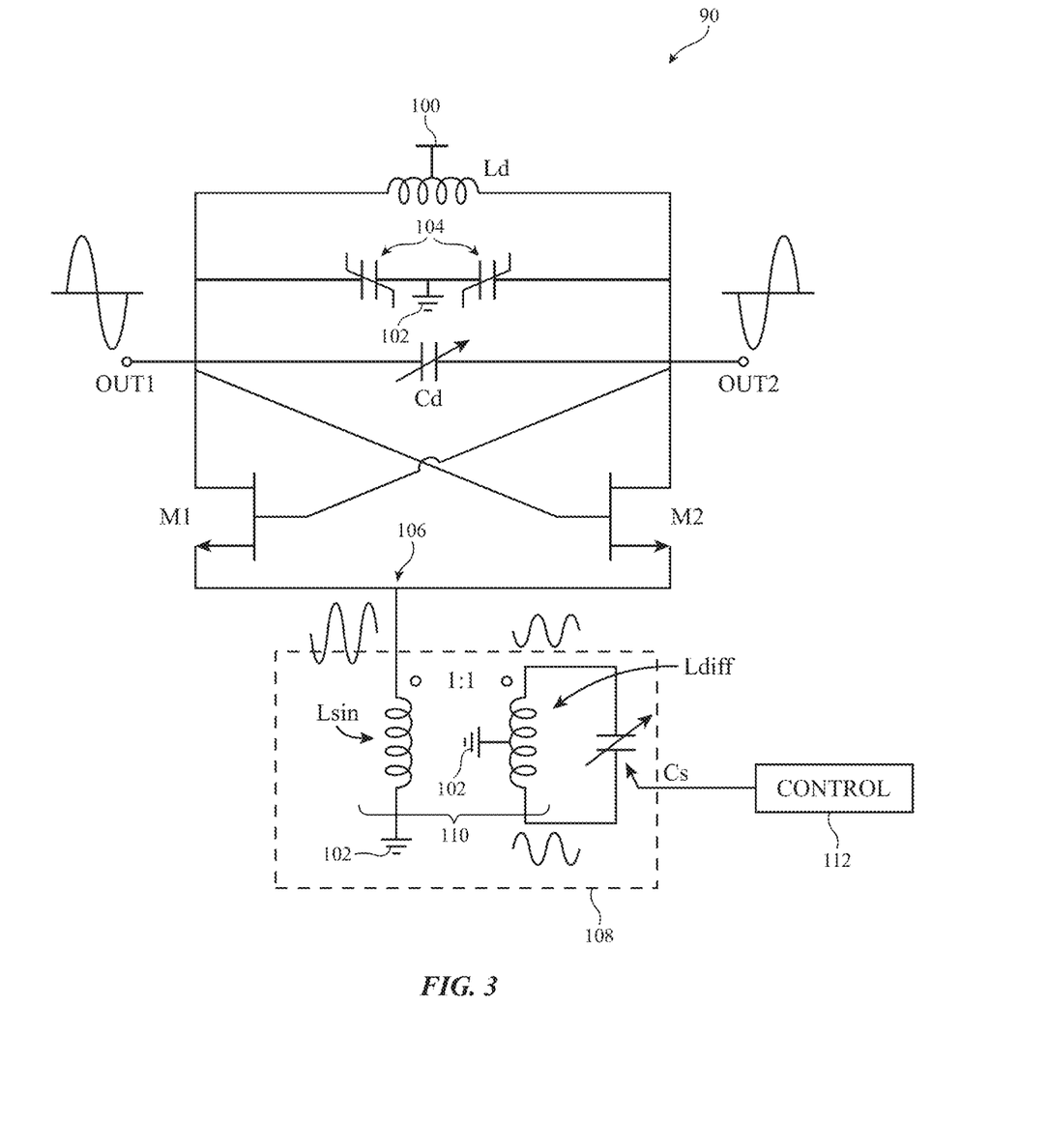
FIG. 3 is a diagram of illustrative oscillator circuitry having a balun phase noise filter in accordance with some embodiments.

FIG. 3 is a diagram of illustrative oscillator circuitry such as oscillator circuitry 90 provided with an improved tail filter such as tail filter 108 in accordance with some embodiments. Oscillator circuitry 90 can represent an oscillator such as a voltage controlled oscillator that may be part of a phase-locked loop (PLL) for generating oscillating signals in LO circuitry 52. As shown in FIG. 3, oscillator circuitry 90 may include transistors M1 and M2, capacitors 104, an output capacitor such as tunable load capacitor Cd, an output inductor such as load inductor Ld, and a coil such as tail coil Lsin.

Transistors M1 and M2 may be n-type (n-channel) transistors such as n-type metal-oxide-semiconductor (NMOS) devices. Transistor M1 may have a source terminal coupled to a tail node such as tail node 106, a drain terminal coupled to a first output terminal OUT1 of circuitry 90, and a gate terminal that is cross-coupled to a second output terminal OUT2 of circuitry 90. Transistor M2 may have a source terminal coupled to tail node 106, a drain terminal coupled to the second output terminal OUT2, and a gate terminal that is cross-coupled to the first output terminal OUT1. Output terminals OUT1 and OUT2 may serve collectively as a differential output port of oscillator circuitry 90. Oscillating (LO) signals can be generated on the differential output port. Transistors M1 and M2 arranged in this way are sometimes referred to as cross-coupled differential transistors.

The terms "source" and "drain" terminals used to refer to current-conveying terminals of a transistor may be used interchangeably and are sometimes referred to as "source-drain" terminals. Thus, the source terminal of transistor M1 can sometimes be referred to as a first source-drain terminal, and the drain terminal of transistor M1 can be referred to as a second source-drain terminal (or vice versa). The term "activate" with respect to a switch (or transistor) may refer to or be defined herein as an action that places the switch in an "on" or low-impedance state such that the two terminals of the switch are electrically connected to conduct current. The term "deactivate" with respect to a switch (or transistor) may refer to or be defined herein as an action that places the switch in an "off" or high-impedance state such that the two terminals of the switch/transistor are electrically disconnected with minimal leakage current.

A first capacitor 104 may have a first terminal coupled to output terminal OUT1 and a second terminal coupled to a ground power supply line such as ground line 102 (e.g., a power supply terminal on which a ground power supply voltage Vss is provided). A second capacitor 104 may have a first terminal coupled to output terminal OUT2 and a second terminal coupled to ground 102. Load (output) inductor Ld may have a first terminal coupled to output terminal OUT1, a second terminal coupled to output terminal OUT2, and a center tap terminal coupled to a positive power supply line such as positive power supply line 100 (e.g., a power supply terminal on which a positive power supply voltage Vdd is provided). Tunable load (output) capacitor Cd may have a first terminal coupled to output terminal OUT1 and a second terminal coupled to output terminal OUT2. Capacitor Cd may have implemented as a programmable bank of capacitors or other types of adjustable capacitive structure. Tail coil Lsin may have a first terminal coupled to tail node 106 and a second terminal coupled to ground line 102. Tail coil Lsin having its second terminal coupled to ground is sometimes referred to herein as being a "single-ended" coil or inductor.

In accordance with an embodiment, the single-ended tail coil Lsin of oscillator circuitry 90 can be implemented as part of a tail filter circuit such as tail filter 108. In the example of FIG. 3, tail filter 108 can further include a coil Ldiff and a tunable capacitor Cs. Coil Ldiff may have a first terminal coupled to a first terminal of capacitor Cs, a second terminal coupled to a second terminal of capacitor Cs, and a center tap terminal coupled to ground line 102 (e.g., coil Ldiff and capacitor Cs are coupled "in parallel"). Coil Ldiff being configured in this way can allow AC (alternating current) signals to oscillate on both of its opposing terminals and is sometimes referred to herein as being a "differential" coil or inductor. Coils Lsin and Ldiff can be inductively coupled to each other and can form a transformer-based circuit such as a balun 110. A "balun" can refer to and be defined herein as a circuit having a balanced (differential) portion and an unbalanced (single-ended) portion. Balun 110 can be configured to translate a common mode impedance at coil Lsin to a differential mode impedance at coil Ldiff, and vice versa. Filter circuit 108 having a balun 110 is thus sometimes referred to herein as a balun phase noise filter or a balun phase noise tail filter. Balun phase noise filter 108 can be configured to reduce a phase noise associated with oscillator circuitry 90. Coils Lsin and Ldiff can be implemented as a 1:1 transformer with the same footprint as a single inductor to save circuit area.

Tunable capacitor Cs can be adjusted by a control circuit such as controller 112. Controller 112 can be part of control circuitry 14 of FIG. 1, processing circuitry 26 of FIG. 2, or transceiver circuitry 28 of FIG. 2. The single-ended to differential impedance transformation of balun 110 can be leveraged to place the tunable capacitor Cs of filter 108 as a fully differential capacitor bank on the secondary side, which exhibits higher quality factor and smaller on resistance compared to a single-ended tunable capacitor. The differences between a single-ended tunable capacitor circuit and a differential tunable capacitor circuit are illustrated in connection with FIGS. 4 and 5.

Figure 4:
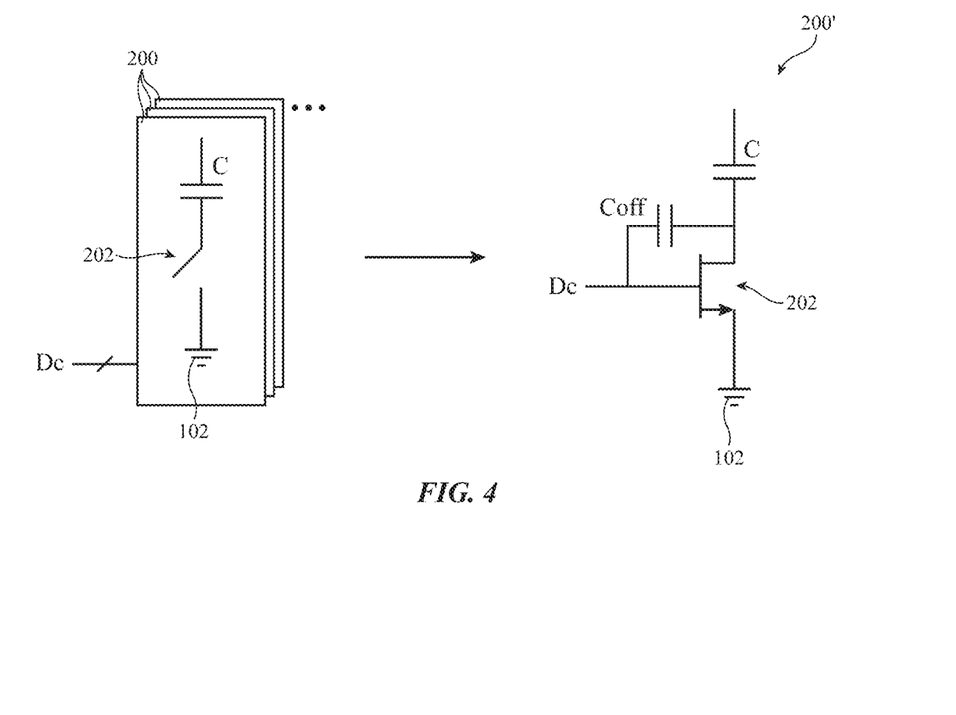
FIG. 4 is a diagram showing one or more single-ended switchable capacitor circuits.

FIG. 4 is a diagram showing a plurality of single-ended tunable capacitor circuits 200. As shown in FIG. 4, each capacitor circuit 200 can include a capacitor with capacitance value C connected in series, to ground line 102, with an associated switch 202. Each capacitor circuit 200 is therefore sometimes referred to as a "switchable" capacitor circuit. Switchable capacitor circuits 200 can be controlled by a digital signal Dc configured to selectively activate and deactivate portions of switchable capacitor circuits 200 (e.g., a first subset of circuits 200 can be activated by turning on the switches 202 in the first subset, whereas a second subset of circuits 200 can be deactivated by turning off the switches 202 in the second subset). Circuit 200' represents an equivalent circuit of a single-ended switchable capacitor circuit 200. As illustrated by equivalent circuit 200', switch 202 can be implemented as a transistor and can have an off state capacitance Coff coupled across the gate and drain terminals of transistor 202. When switch 202 is deactivated, the total capacitance of circuit 200' is equal to C in series with Coff, which will be approximately equal to Coff assuming the capacitance C is much larger than Coff.

Figure 5:
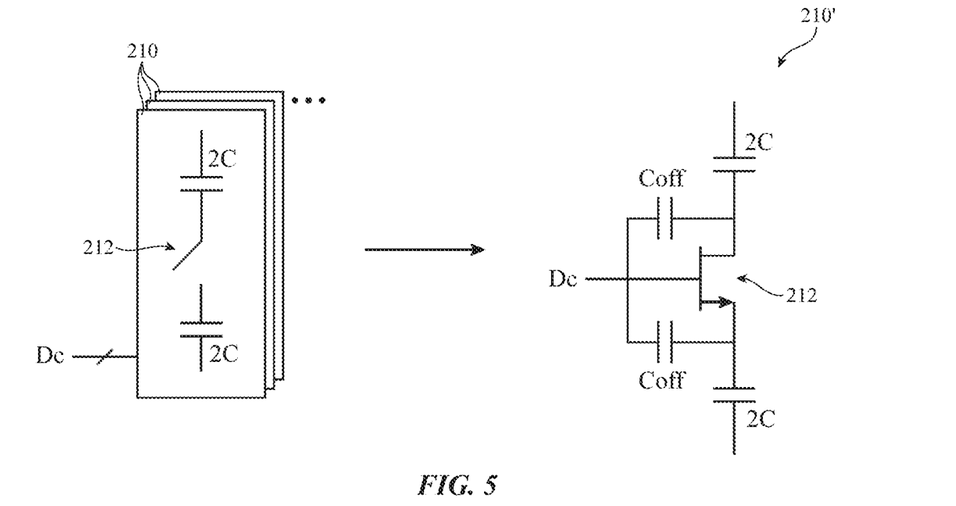
FIG. 5 is a diagram showing one or more differential switchable capacitor circuits in accordance with some embodiments.

FIG. 5 is a diagram showing a plurality of differential tunable capacitor circuits 210. As shown in FIG. 5, each capacitor circuit 210 can include a switch 212 coupled between two capacitors each with capacitance value of 2 C. Each capacitor circuit 210 is therefore sometimes referred to as a differential "switchable" capacitor circuit. Switchable capacitor circuits 210 can be controlled by a digital signal Dc configured to selectively activate and deactivate portions of switchable capacitor circuits 210 (e.g., a first subset of circuits 210 can be activated by turning on the switches 212 in the first subset, whereas a second subset of circuits 210 can be deactivated by turning off the switches 212 in the second subset). Digital signal Dc can be output by controller 112 (see FIG. 3).

Circuit 210' represents an equivalent circuit of a differential switchable capacitor circuit 210. As illustrated by equivalent circuit 210', switch 212 can be implemented as a transistor and can have a first off state capacitance Coff coupled across the gate and drain terminals of transistor 212 and a second off state capacitance Coff coupled across the gate and source terminals of transistor 212. When switch 212 is deactivated, the total capacitance of circuit 210' is equal to C in series with Coff/2, which will be approximately equal to Coff/2 assuming capacitance C is much larger than Coff/2. In the other words, for the same transistor size (i.e., for the same on resistance), the differential switchable capacitor circuit 210 exhibits half the off capacitance compared to the single-ended switchable capacitor circuit 200. Thus, in accordance with some embodiments, the tunable capacitor Cs of balun phase noise filter 108 can be implemented as a plurality (or bank) of differential switchable capacitor circuits 210. Tunable capacitor Cs implemented as a plurality of differential switchable capacitor circuits 200 is sometimes referred to herein as a tunable capacitor circuit or a tunable capacitance. Implementing tunable capacitor Cs in this way can be technically advantageous and beneficial to improve the quality factor and the tuning range of filter 108, thus yielding enhanced suppression of phase/flicker noise.

Figure 6:
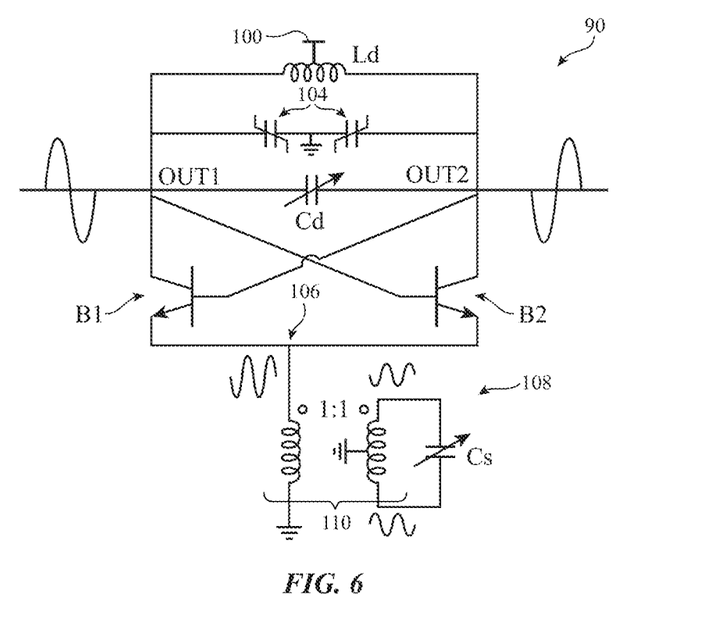
FIG. 6 is a diagram of illustrative oscillator circuitry having bipolar junction transistors in accordance with some embodiments.

The embodiment of FIG. 3 in which oscillator circuitry 90 includes only NMOS transistors M1 and M2, without any p-type transistors, is exemplary. FIG. 6 illustrates another embodiment in which oscillator circuitry 90 is implemented using bipolar junction transistors (BJTs) B1 and B2. As shown in FIG. 6, first bipolar junction transistor B1 may have an emitter terminal coupled to tail node 106, a collector terminal coupled to the first output terminal OUT1 of circuitry 90, and a gate terminal that is cross-coupled to the second output terminal OUT2 of circuitry 90. Second bipolar junction transistor B2 may have an emitter terminal coupled to tail node 106, a collector terminal coupled to the second output terminal OUT2, and a gate terminal that is cross-coupled to the first output terminal OUT1. The remaining structure of oscillator circuitry 90 is identical to that already described in connection with FIG. 3 and need not be reiterated to obscure the present embodiment.

The example of FIG. 6 in which the transistors of oscillator circuitry 90 are implemented as bipolar junction transistors is exemplary. In general, oscillator circuitry 90 can be implemented using metal-oxide-semiconductor field-effect transistors (MOSFETs), bipolar junction transistors (BJTs), insulated-gate bipolar transistors (IGBTs), junction field-effect transistors (JFETs), tunnel field-effect transistors (TFETs), fin field-effect transistors (FinFETs), silicon-on-insulator (SOI) transistors, carbon nanotube transistors, nanowire transistors, a combination of these transistors, and/or other types of transistors.

Figure 7:
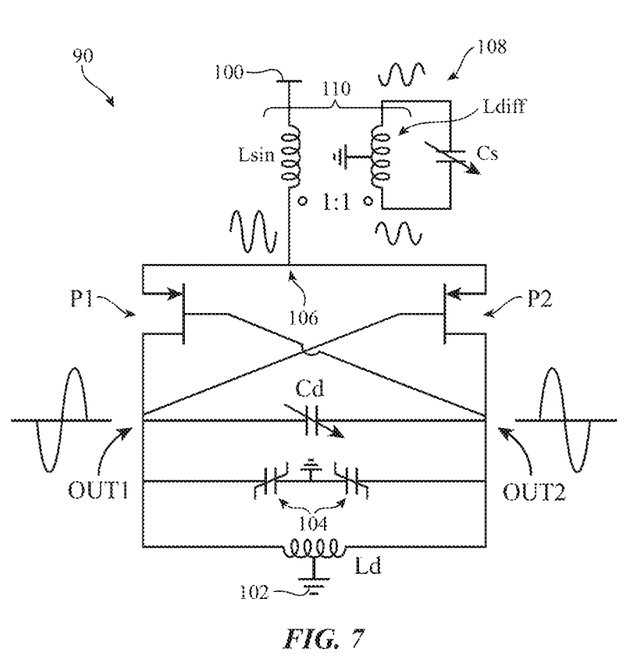
FIG. 7 is a diagram of illustrative oscillator circuitry having p-type transistors in accordance with some embodiments.

FIG. 7 is a diagram showing another embodiment of oscillator circuitry 90 having passive components and only p-type transistors (without any n-type transistors). As shown in FIG. 7, oscillator circuitry 90 may include transistors P1 and P2, capacitors 104, an output capacitor such as tunable load capacitor Cd, an output inductor such as load inductor Ld, and a coil such as tail coil Lsin. Transistors P1 and P2 may be p-type (p-channel) transistors such as p-type metal-oxide-semiconductor (PMOS) devices. Transistor p1 may have a source terminal coupled to a tail node such as tail node 106, a drain terminal coupled to a first output terminal OUT1 of circuitry 90, and a gate terminal that is cross-coupled to a second output terminal OUT2 of circuitry 90. Transistor P2 may have a source terminal coupled to tail node 106, a drain terminal coupled to the second output terminal OUT2, and a gate terminal that is cross-coupled to the first output terminal OUT1. Output terminals OUT1 and OUT2 may serve collectively as a differential output port of oscillator circuitry 90. Oscillating (LO) signals can be generated on the differential output port. Transistors P1 and P2 arranged in this way are sometimes referred to as cross-coupled differential transistors.

A first capacitor 104 may have a first terminal coupled to output terminal OUT1 and a second terminal coupled to ground line 102. A second capacitor 104 may have a first terminal coupled to output terminal OUT2 and a second terminal coupled to ground 102. Load (output) inductor Ld may have a first terminal coupled to output terminal OUT1, a second terminal coupled to output terminal OUT2, and a center tap terminal coupled to ground line 102. Tunable load (output) capacitor Cd may have a first terminal coupled to output terminal OUT1 and a second terminal coupled to output terminal OUT2. Capacitor Cd may have implemented as a programmable bank of capacitors or other types of adjustable capacitive structure. Tail coil Lsin may have a first terminal coupled to tail node 106 and a second terminal coupled to positive power supply line 100. Tail coil Lsin having its second terminal coupled to power supply terminal 100 is sometimes referred to herein as being a "single-ended" coil or inductor.

In accordance with an embodiment, the single-ended tail coil Lsin of oscillator circuitry 90 can be implemented as part of a tail filter circuit such as tail filter 108. In the example of FIG. 7, tail filter 108 can further include a coil Ldiff and a tunable capacitor Cs. Coil Ldiff may have a first terminal coupled to a first terminal of capacitor Cs, a second terminal coupled to a second terminal of capacitor Cs, and a center tap terminal coupled to ground line 102 (e.g., coil Ldiff and capacitor Cs are coupled "in parallel"). Coil Ldiff being configured in this way can allow AC (alternating current) signals to oscillator on both of its opposing terminals and is sometimes referred to herein as being a "differential" coil or inductor. Coils Lsin and Ldiff can be inductively coupled to each other and can form a transformer-based circuit such as a balun 110. Coils Lsin and Ldiff can be implemented as a 1:1 transformer with the same footprint as a single inductor to save circuit area.

The single-ended to differential impedance transformation of balun 110 can be leveraged to place the tunable capacitor Cs of filter 108 as a fully differential capacitor bank on the secondary side, which exhibits higher quality factor and smaller on resistance compared to a single-ended tunable capacitor. The tunable capacitor Cs of balun phase noise filter 108 can be implemented as a plurality (or bank) of differential switchable capacitor circuits 210 (see, e.g., FIG. 5). Implementing tunable capacitor Cs in this way can be technically advantageous and beneficial to improve the quality factor and the tuning range of filter 108, thus yielding enhanced suppression of phase/flicker noise.

Figure 8:
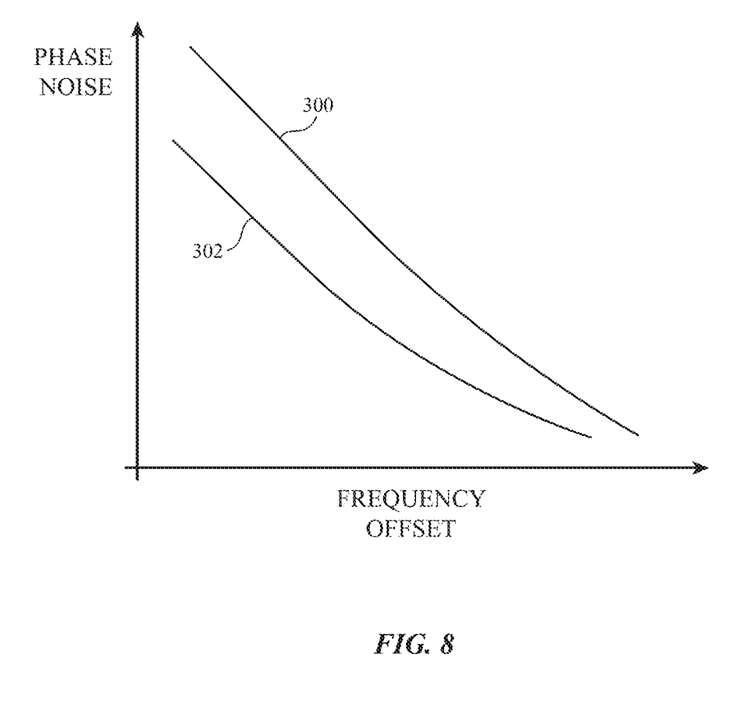
FIG. 8 is a plot showing how phase noise can be reduced by employing a balun phase noise filter in accordance with some embodiments.

FIG. 8 is a plot showing how phase noise can be reduced by employing a balun phase noise filter 108 of the type described in connection with FIGS. 1-7. The x-axis plots frequency offset, which represents the frequency delta between a potential noise signal and the main carrier signal of interest. In FIG. 8, curve 300 represents the phase noise profile for an LC voltage-controlled oscillator with a single-ended tail filter (i.e., a tail filter having a tail inductor coupled in parallel with only single-ended switchable capacitor circuits 200). In contrast, curve 302 represents the phase noise profile for oscillator circuitry 90 having balun phase noise tail filter 108 (e.g., a tail filter having a balun 110 coupled to tunable capacitor Cs optionally implemented as differential switchable capacitor circuits 210). As can be seen from FIG. 8, curve 302 shows reduced phase/flicker noise levels relative to curve 300 across a wide range of frequency offset values.

The methods and operations described above in connection with FIGS. 1-8 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is illustrative and various modifications can be made to the described embodiments. The foregoing embodiments may be implemented individually or in any combination.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. Circuitry comprising:
a first transistor having a first source-drain terminal coupled to a tail node;
a second transistor having a first source-drain terminal coupled to the tail node;
load components coupled to a second source-drain terminal of the first transistor and a second source-drain terminal of the second transistor;
a first coil having a first terminal coupled to the tail node and having a second terminal coupled to a power supply line;
a second coil inductively coupled to the first coil; and
a tunable capacitor connected to the second coil.

2. The circuitry of claim 1, wherein:
the first transistor has a gate terminal coupled to the second source-drain terminal of the second transistor; and
the second transistor has a gate terminal coupled to the second source-drain terminal of the first transistor.

3. The circuitry of claim 2,
wherein the load components comprise a tunable load capacitor having a first terminal coupled to the second source-drain terminal of the first transistor and having a second terminal coupled to the second source-drain terminal of the second transistor.

4. The circuitry of claim 3,
wherein the load components further comprise a load inductor having a first terminal coupled to the second source-drain terminal of the first transistor, a second terminal coupled to the second source-drain terminal of the second transistor, and a center tap terminal coupled to an additional power supply line different than the power supply line.

5. The circuitry of claim 4, wherein the load components further comprise:
a first capacitor coupled between the second source-drain terminal of the first transistor and the power supply line; and
a second capacitor coupled between the second source-drain terminal of the second transistor and the power supply line.

6. The circuitry of claim 1, wherein the tunable capacitor has a first terminal coupled to a first terminal of the second coil and a second terminal coupled to a second terminal of the second coil.

7. The circuitry of claim 6, wherein the second coil has a center tap terminal coupled to the power supply line.

8. The circuitry of claim 6, wherein the tunable capacitor comprises:
a plurality of switchable capacitor circuits, each of which includes a switch coupled between a pair of capacitors.

9. The circuitry of claim 1, wherein the first and second transistors comprise one of: n-type metal-oxide-semiconductor (NMOS) transistors, bipolar junction transistors, and p-type metal-oxide-semiconductor (PMOS) transistors.

10. Oscillator circuitry comprising: a first transistor having a drain terminal coupled to a first output terminal; a second transistor having a drain terminal coupled to a second output terminal, an oscillating signal being produced at the first and second output terminals; and a balun that includes a first coil having a first terminal coupled to source terminals of the first and second transistors and a second coil having a center tap terminal coupled to a power supply line.

11. The oscillator circuitry of claim 10, the first coil further includes a second terminal coupled to the power supply terminal.

12. The oscillator circuitry of claim 10, further comprising: a tunable capacitor having a first terminal coupled to a first terminal of the second coil and having a second terminal coupled to a second terminal of the second coil.

13. The oscillator circuitry of claim 12, wherein the tunable capacitor comprises a plurality of differential switchable capacitor circuits.

14. The oscillator circuitry of claim 13, wherein at least one differential switchable capacitor circuit in the plurality of differential switchable capacitor circuits comprises a switch coupled between a pair of equally sized capacitors.

15. The oscillator circuitry of claim 10, further comprising: a load inductor coupled across the first and second output terminals; and a tunable load capacitor coupled across the first and second output terminals.

16. Oscillator circuitry comprising: a first transistor having a first source-drain terminal coupled to a first output terminal; a second transistor having a first source-drain terminal coupled to a second output terminal; a load inductor coupled across the first and second output terminals; a tunable load capacitor coupled across the first and second output terminals; and a balun phase noise filter configured to reduce a phase noise associated with the oscillator circuitry and including a first coil having a first terminal coupled to the first and second transistors and a second terminal directly coupled to a ground line.

17. The oscillator circuitry of claim 16, wherein the first transistor further comprises a gate terminal coupled to the second output terminal and wherein the second transistor further comprises a gate terminal coupled to the first output terminal.

18. The oscillator circuitry of claim 16, wherein the balun phase noise filter further comprises: a second coil inductively coupled to the first coil balun; and a tunable capacitance coupled across the second coil.

19. The oscillator circuitry of claim 18, wherein the tunable capacitance comprises a plurality of differential switchable capacitor circuits.

* * * * *